United States Patent
Yu et al.

(10) Patent No.: US 6,403,432 B1
(45) Date of Patent: Jun. 11, 2002

(54) HARDMASK FOR A SALICIDE GATE PROCESS WITH TRENCH ISOLATION

(75) Inventors: Chen-Hua Yu; Syun-Ming Jang, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/637,353

(22) Filed: Aug. 15, 2000

(51) Int. Cl.[7] .................................. H01L 21/336
(52) U.S. Cl. ................... 438/296; 438/303; 438/305; 438/307; 438/424
(58) Field of Search ................... 438/294, 296, 438/303, 305, 306, 307, 424

(56) References Cited

U.S. PATENT DOCUMENTS

| | | | |
|---|---|---|---|
| 5,061,647 A | 10/1991 | Roth et al. ................... 437/40 |
| 5,169,487 A | 12/1992 | Langley et al. ............. 156/643 |
| 5,364,817 A | * 11/1994 | Lur et al. |
| 5,431,770 A | 7/1995 | Lee et al. ................. 156/653.1 |
| 5,796,151 A | 8/1998 | Hsu et al. ................... 257/410 |
| 5,838,716 A | * 11/1998 | Chang et al. ............... 373/111 |
| 6,163,045 A | * 12/2000 | Mandelman et al. ....... 257/301 |

* cited by examiner

*Primary Examiner*—Long Pham
(74) *Attorney, Agent, or Firm*—George O. Saile; Stephen B. Ackerman

(57) ABSTRACT

A method for forming of a self-aligned polysilicon gate MOSFET with silicon oxide shallow trench isolation is described wherein a hardmask is used to etch the polysilicon gate electrode. The hardmask is formed of a material which has a significantly high etch rate in dilute HF than the trench isolation so that the residual hardmask may be later removed with minimal attack of the shallow trench oxide which is also exposed to the aqueous etch. The preferred hardmask material is a borophosphosilicate glass (BPSG), although a phosphosilicate glass PSG may be used as well. The BPSG erodes at about the same rate as a silicon oxide hardmask during the polysilicon etch but offers the advantage of a higher aqueous HF etch rate during hardmask removal. The BPSG hardmask is left in place during LDD sidewall spacer formation and is removed just prior to the source/drain ion implantation. By leaving the residual hardmask in place during sidewall spacer formation, the polysilicon gate is recessed in a cavity formed by the sidewall spacers, thereby reducing the risk of subsequent gate-to-source/drain shorts.

13 Claims, 4 Drawing Sheets

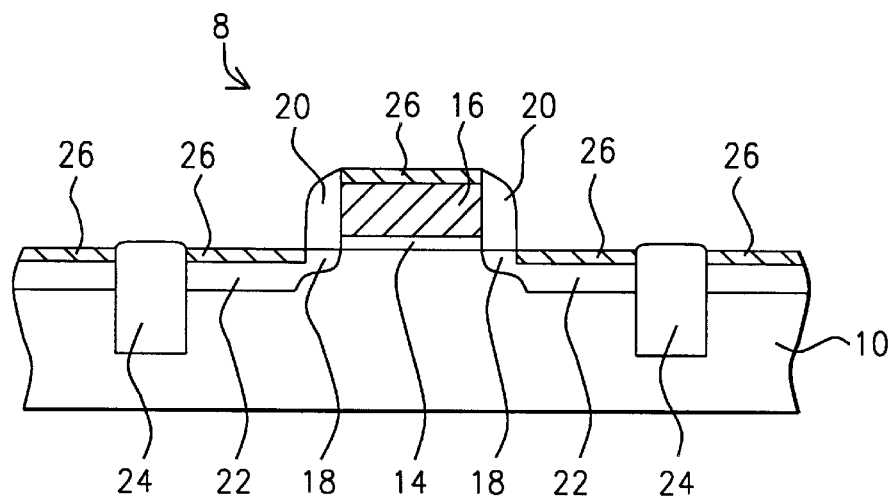
FIG. 1 – Prior Art
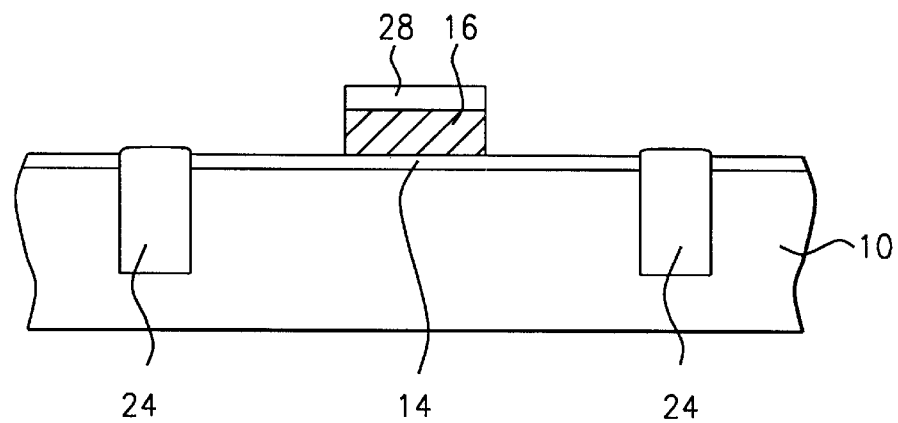
FIG. 2A
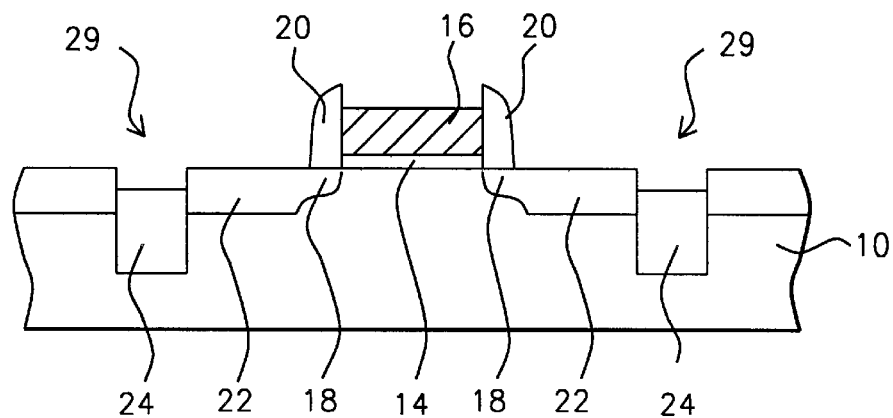
FIG. 2B

HARDMASK FOR A SALICIDE GATE PROCESS WITH TRENCH ISOLATION

RELATED PATENT APPLICATION

Ser. No. 09/507,645, filing date Feb. 22, 2000, "A NEW HARD MASK PROCESS FOR SALICIDE GATE WITH A SPECIAL ETCH", C. H. Yu and S. M. Jang, assigned to a common assignee.

BACKGROUND OF THE INVENTION (1) Field of the Invention

The invention relates to processes for the manufacture of semiconductor devices and more particularly to processes for forming suicides on self-aligned polysilicon gate field effect transistors.

(2) Background of the Invention and Description of Previous Art

Self-aligned polysilicon gate field effect transistors are widely used as the preferred semiconductor device in nearly all integrated circuit applications. This is because of their low current utilization and ease of manufacture compared to bipolar transistors. In addition, the simple structure of these devices lends itself well to size reduction, thereby permitting many thousands of complex circuits to be fabricated on a relatively small chip area. One outstanding characteristic of these devices is the ability to ability to form their source and drain device elements self-aligned to the polysilicon control gate. In recent years the electrical performance of these devices has been further improved by including a LDD (lightly doped drain) structure which is also formed, self-aligned to the control gate.

For many years the FET (field effect transistors) device was fabricated in active silicon island surrounded by a field oxide which was formed by the LOCOS (local oxidation of silicon) process. The LOCOS process was first proposed by Kooi in the mid 1960's and has enjoyed a long period of success. However, in recent years, many applications are replacing LOCOS field oxide with shallow trench isolation (STI) which can be adapted to smaller dimensions and is exempt form the traditional LOCOS problems such as "birds beak" and thermal stresses. STI is formed by anisotropically etching trenches into the silicon substrate, providing a thin thermal oxide liner, and then filling the trenches with an insulative material at low temperatures. Typically, silicon oxide is deposited into the openings at low temperatures by PECVD (plasma enhanced chemical vapor deposition). The surface is then planarized by CMP (chemical mechanical polishing).

FIG. 1 shows a cross section of a familiar form of the self-aligned polysilicon gate MOSFET (metal oxide silicon field effect transistor) 8. formed with STI. The silicon oxide filled trenches 24 form the field isolation around the device 8. The polysilicon gate electrode 16 is photolithographically patterned over a thin gate oxide 14 using photoresist. The LDD portions 18 of the source/drain elements are then formed by ion implantation using the gate 16 as a self-aligned mask. Sidewall spacers 20 are formed which then, along with the gate electrode 16 mask the main portions 22 of the source/drain elements in a second ion implantation. A refractory metal, for example titanium, is deposited over the wafer and is reacted with the polysilicon gate and the exposed source/drain region to form $TiSi_2$. Unreacted Ti is removed by wet etching leaving the $TiSi_2$ 26 on the silicon surfaces. Formation of a silicide simultaneously on the polysilicon gate and source drain regions to form contact regions is known as the salicide (self-aligned silicide) process.

In earlier technologies, relatively thick photoresist masks were allowable to protect the polysilicon during patterning of the gate electrode 16 by anisotropic etching. Present day sub-quarter micron technology, no longer permits the use of thick photoresist layers because of the reduced depth of field at the shorter radiation wavelengths used to expose the patterns. It therefore becomes expedient to introduce a hard mask for patterning the polysilicon gate 16. The use of a hardmask also provides higher etch rate selectivities between polysilicon and silicon oxide, thereby improving the capability of stopping the etch on the thin gate oxide layer. The hardmask material is first deposited over the polysilicon layer and patterned with a thin photoresist mask. The hardmask material, typically silicon oxide, is more durable in the polysilicon gate patterning plasma than photoresist.

Lee, U.S. Pat. No. 5,431,770 teaches the use of a hardmask, typically $SiO_2$, which is patterned by photoresist and then isotropically wet etched to reduce it's planar dimensions below the dimensional limits of the photolithography. The shrunken mask is then used to etch device features which are smaller than the photolithographic limits. Similarly, Roth. et.al., U.S. Pat. No. 5,061,647 anisotropically etches a pattern in a conductive layer with a photoresist mask and then undercuts the photoresist by isotropically etching the conductive layer to laterally and uniformly reduce it's lateral dimensions below the photoresist dimensions. The reduced conductive layer pattern is then used as a hardmask to anisotropically etch features in subjacent layers which are smaller than the original photolithographic pattern.

Hsu, et.al., U.S. Pat. No. 5,796,151 teaches a $Si_3N_4$ layer covering a partially formed gate stack having W and TiN layers. The $Si_3N_4$ layer forms a sidewall on the partially formed gate stack and serves as a hardmask for further etching the gate stack through a polysilicon layer stopping in a gate oxide. Alternately silicon oxynitride or silicon oxide may be used in place of the $Si_3N_4$. Langley, et.al., U.S. Pat. No. 5,169,487 etches a silicon oxide, silicide, polysilicon stack stopping in a subjacent silicon oxide layer using a photoresist mask which survives the entire etch process. Carbon generated by the etch gases and by erosion of the photoresist passivates the sidewalls of the structure thereby permitting an essentially vertical etch profile.

Referring again to FIG. 1, after the gate 16 is patterned a refractory metal silicide layer 26 is selectively formed on the polysilicon gate 16 and the active silicon regions 18, 22 which will form the source/drain elements of the FET. This process is also self-aligning and is commonly referred to as the "salicide" (self-aligned silicide) process. The silicide coating improves the conductivity of the polysilicon and assists in achieving good ohmic contact to the source/drain regions of the device. However, a problem has been found to occur by the present inventors, when a silicon oxide hardmask is used to pattern the polysilicon gate electrode when silicon oxide STI is present.

FIG. 2A shows a cross section of an in-process self-aligned polysilicon gate MOSFET after the polysilicon gate has been patterned with a silicon oxide hardmask 28. The anisotropic polysilicon etch is terminated on the gate oxide 14. Referring to FIG. 2B, the residual hardmask 28 as well as the thin gate oxide 14 over the active silicon regions adjacent to the gate structure 16 are removed after sidewall 20 formation, by wet etching with dilute HF to prepare the silicon surfaces for salicide formation. However, the wet etchant also attacks the exposed STI 24. This results in an unacceptable gouging 29 of the STI in the trenches. The gouging has been found by the present inventors to penetrate the STI sufficiently to interact with the adjacent source/drain junctions causing serious device degradation by junction leakage. Subsequently formed conductive silicide along the exposed walls of the trenches can cause junction leakages and shorts.

Field isolation formed by the LOCOS process does not present these problems. Junctions abutting LOCOS field isolation have sufficient thickness of overlying oxide at the point of abutment, that an HF etchant can safely be used to remove residual SOG or silicon oxide hardmask, without risking exposure of the junction. This margin of error is not available to STI isolation. It would therefore be desirable to have a hardmask material and an etchant-formulation which etches the hardmask much faster than silicon oxide so that the hardmask may be safely removed with minimal attack of the STI, This invention provides a formulation for such a hardmask and etchant as well as a method for use which provides additional benefits.

SUMMARY OF THE INVENTION

It is an object of this invention to provide an improved method for patterning a polysilicon gate electrode on a polysilicon gate MOSFET with shallow trench isolation.

It is another object of this invention to provide a hardmask for patterning polysilicon and polycide layers which has a high durability for plasma etching of polysilicon and in addition, has an etch rate in an aqueous HF etchant which is significantly greater than the etch rate of silicon oxide in the same aqueous HF etchant.

It is yet another object of this invention provide a hardmask which can be thermally flowed to improve the planarity of subsequently applied photoresist and thereby improve the overall sharpness of focus in narrow depth of field photolithography.

It is still another object of this invention to provide a method for forming a self-aligned polysilicon gate MOSFET with STI and with salicide contact metallization.

It is yet another object of this invention to provide a method for reducing gate-to-source/drain bridging in a polysilicon gate MOSFET.

These objects are accomplished by patterning the polysilicon layer with a hardmask formed of BPSG (borophosphosilicate glass) or PSG (phosphosilicate glass). BPSG and PSG offer the additional advantage of being thermally flowable to provide a planer surface. A silicon wafer having regions of shallow trench silicon oxide isolation is provided. A gate oxide is formed and a polysilicon layer is deposited on the gate oxide. A layer of the flowable hardmask material is then deposited on the polysilicon and the layer is thermally flowed which forms a more planar surface. The hardmask is prepared by first depositing an organic BARC (bottom anti-reflective coating) on the blanket layer of hardmask material. The hardmask is then patterned by using a photoresist mask. Residual photoresist is stripped and the polysilicon layer is anisotropically etched by RIE (reactive ion etching) or by plasma etching. The hardmask suffers little erosion during polysilicon etching which is conducted under conditions of high polysilicon-to-silicon oxide selectivity so that the etching may be safely terminated on the subjacent gate oxide. An over-etch period is provided to removed all vestiges of un-masked polysilicon without penetration of the gate oxide.

The residual hardmask is wet etched with the aqueous dilute HF just prior to source/drain ion implantation. Attack of exposed STI oxide by the HF etchant is negligible because the hardmask material etches much faster that the STI oxide. A layer of titanium is then deposited. A protective TiN layer may be alternatively be deposited over the Ti layer. A rapid thermal anneal forms $TiSi_2$ in the regions where silicon and polysilicon surfaces are in contact with the Ti layer. Wet etching in $NH_4OH$ and $H_2O_2$, removes the TiN and unreacted Ti, leaving $TiSi_2$ on the polysilicon patterns and on the silicon active areas. The sidewalls, having been formed with the residual hardmask in place, extend above the plane of the polysilicon gate. This provides an extended surface path between the gate and the source/drain regions and thereby reduces the risk of gate-to-source/drain bridging during silicide formation.

BRIEF DESCRIPTION OF THE DRAWINGS

FIG. 1 is a cross section of a familiar self-aligned polysilicon gate MOSFET with shallow trench isolation.

FIG. 2A is a cross section of a portion of a silicon wafer showing a residual silicon oxide hardmask which was used to etch a polysilicon gate of a MOSFET with shallow trench silicon oxide isolation.

FIG. 2B is a cross section of a portion of a silicon wafer showing the undesirable gouging of exposed shallow trench silicon oxide isolation regions during the wet etching removal of a conventional silicon oxide hardmask.

DESCRIPTION OF THE PREFERRED EMBODIMENTS

Figure 3A:
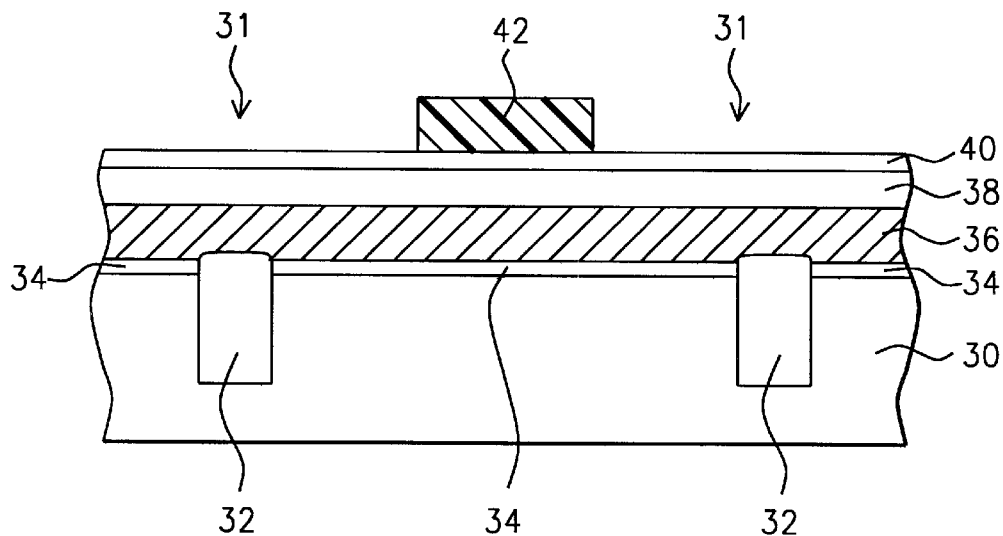
FIG. 3A through FIG. 3G are cross sections of a portion of a silicon wafer illustrating a sequence of processing steps in the formation of a self-aligned gate MOSFET with shallow trench silicon oxide isolation according to the teaching of the embodiment of this invention.

In a preferred embodiment of this invention a 200 mm. diameter p-type monocrystalline silicon wafer is provided. Referring to FIG. 3A, there is shown a cross section of a region of the silicon wafer 30 in which an n-channel self-aligned polysilicon gate MOSFET with STI is to be formed. A trench 31 surrounding silicon active area is formed in the wafer 30 by reactive ion etching. The trench is between about 300 and 500 nm. deep and between about 150 and 250 nm. in breath. A thin (<20 nm.) silicon oxide liner first grown by thermal oxidation and the trench is filled with silicon oxide 32 deposited by PECVD. A thin (<20 nm.) silicon nitride or silicon oxynitride barrier layer may alternately be included between the thermal silicon oxide liner and the filler oxide. After deposition, the filler oxide 32 is densified by subjecting the wafer 30 to an ambient of wet oxygen or steam at a temperature of 800° C. or thereabout for a period of about 30 minutes.

The surface of the wafer 30 is next subjected to a planarization process, preferably CMP (chemical mechanical polishing). The CMP removes the extraneous filler material over the planar regions of the wafer. Alternative methods of planarization such as reactive ion etchback may also be employed. CMP and other planarization methods are well known and widely practiced. The filler oxide densification step may alternately be performed after the planarization step.

A layer of gate oxide 34 is thermally grown on the surface of the wafer 30. The gate oxide is between about 1.5 and 2.0 nm. thick and is grown by methods well known in the art. A layer of polysilicon 36 between about 150 and 200 nm. thick is deposited over the gate oxide 34, preferably by PECVD. Next a layer of BPSG 38 is deposited onto the polysilicon layer 36. The BPSG is deposited by PECVD by adding $PH_3$ and $BH_3$ to conventional CVD $SiO_2$ precursors, for example $Si_2H_2$—$N_2O$. Alternately the BPSG layer 38 may formed by the decomposition of tetraethylorthosilicate (TEOS) in the presence of boron and phosphorous containing compounds such as trimethyl borate and trimethyl phosphate. Deposition of BPSG by these methods are well known and the composition of the layer may be controlled by varying the deposition parameters. In the current embodiment the BPSG layer contains between about 4 and 4.5 percent by weight of phosphorous and between about 4 and 4.5 percent by weight of boron.

Alternately the layer 38 may be formed of PSG (phosphosilicate glass) PSG is commonly used as a passivation layer in integrated circuits and it is well known for it's ability to getter mobile ion contaminants. It may also be formed by PECVD by adding $PH_3$ to CVD $SiO_2$ precursors.

After deposition, the BPSG layer is flowed by subjecting the layer to a rapid thermal annealing (RTA) at a temperature of between about 500 and 1,000° C. in a nitrogen ambient for a period of between about 30 and 60 seconds. Alternately, the annealing may be performed in a furnace. RTA is a well known practice which causes fast surface heating by radiation from a lamp. Flowing the BPSG in this manner densifies the BPSG thereby reducing it's tendency to absorb moisture or other contaminants. In addition, densification of the BPSG by flowing stabilizes it's etch rate. Flowing of the BPSG layer also improves the planarity of the BPSG surface and thereby likewise the planarity of a subsequently deposited photoresist layer. Good planarity of the photoresist is critical for achieving an overall sharp image focus in the very narrow depth-of-field afforded by Deep UV photolithography.

An organic BARC (bottom anti-reflective coating) 40 is applied on the BPSG layer 38. The BARC 40 prevents secondary reflections from degrading the edges of a subsequent photoresist image. The use of a BARC is optional in the present embodiment. A layer of photoresist 42 is patterned on the BARC layer to define a gate electrode using well known photolithographic procedures. The current embodiment contemplates the use of deep UV (ultraviolet) stepper photolithography which embraces radiation wavelength of 490 nm. and below. In order to accommodate these short wavelengths, the thickness of the photoresist layer is between about 200 and 400 nm.

Figure 3B:
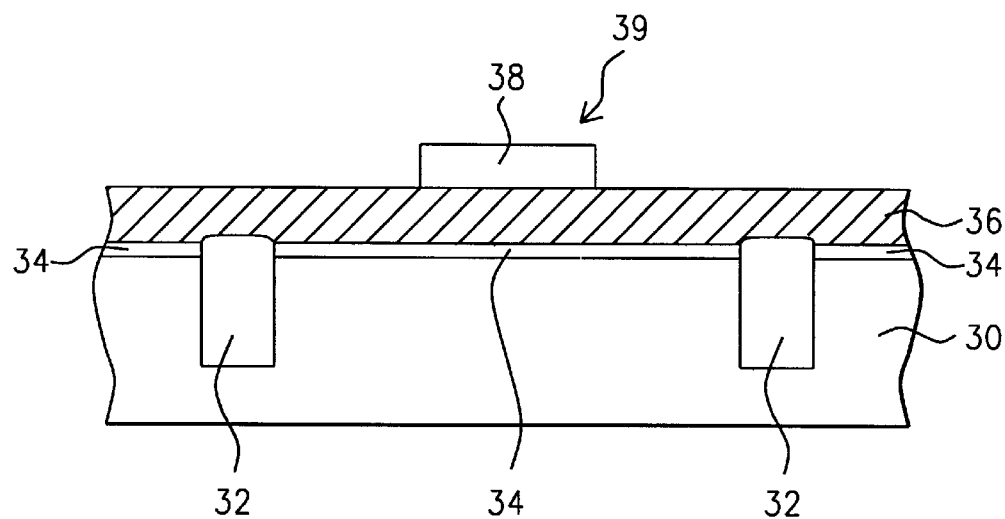

Referring now to FIG. 3B, the BARC and the BPSG layer 38 is etched by RIE to form a BPSG hardmask 39. The anisotropic etching is accomplished using and etchant containing fluorocarbons. Etchant compositions and etching parameters for BPSG are well known in the art. Residual photoresist and BARC are afterwards stripped, preferably by plasma ashing, or alternatively by the use of a liquid stripper. Alternately, the residual photoresist and BARC may be left in place and removed in the early stages of the subsequent polysilicon etch.

The hardmask 39 is now used to pattern the polysilicon layer 36 to form a gate electrode. The wafer 30 is placed into a high density plasma(HDP) parallel plate reactor. A suitable reactor is the model TCP-9400 manufactured by LAM Research Corporation of Fremont, Calif.

The polysilicon layer 36 is etched with an etchant composition consisting of $Cl_2$ at a flow rate of between about 70 and 90 SCCM, HBr at a flow rate of between about 110 and 130 SCCM in a carrier gas of helium. The flow rate of the carrier gas is adjusted to maintain a pressure of between about 8 and 12 mTorr in the reactor chamber. An rf discharge is having a power of about 250 Watts TCP and about 200 Watts BIAS is struck and maintained until an endpoint is reached. Under these conditions, a polysilicon-to-BPSG hardmask selectivity of between about 10:1 and 15:1 is achieved. The endpoint is determined by optical emission spectroscopy by observing the decline of a silicon peak at 405 nm. This occurrence signals the appearance of patches of exposed gate oxide and the onset of clearing the surface of polysilicon.

In order to minimize the loss of gate oxide 34, the etchant composition is now altered to further increase the selectivity of polysilicon over silicon oxide in an over etch period. The over etch removes all vestiges of exposed polysilicon and is performed as a timed etch, with an etchant composition consisting of HBr at a flow rate of between about 180 and 220 SCCM, a 70%He+30% $O_2$ mixture at a flow rate of between about 2 and 4 SCCM in a helium carrier gas. The flow of the carrier gas is adjusted to maintain a pressure of between about 55 and 65 mTorr in the reactor chamber. An rf power of about 230 Watts TCP and about 180 Watts BIAS is applied and maintained for an over etch time period of between about 20 and 40 seconds.

Figure 3C:
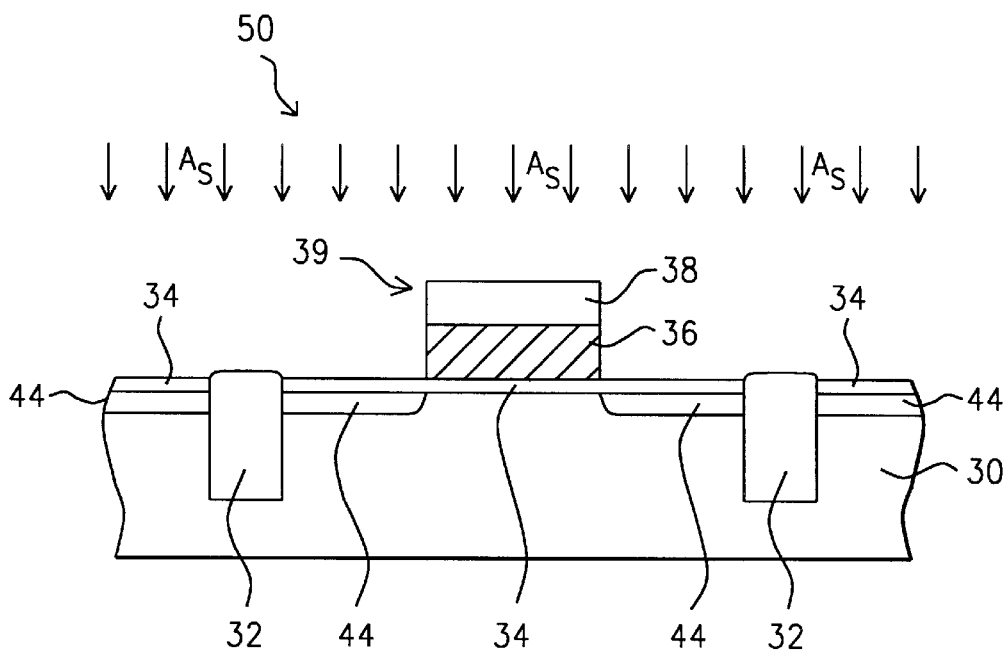
Figure 3D:
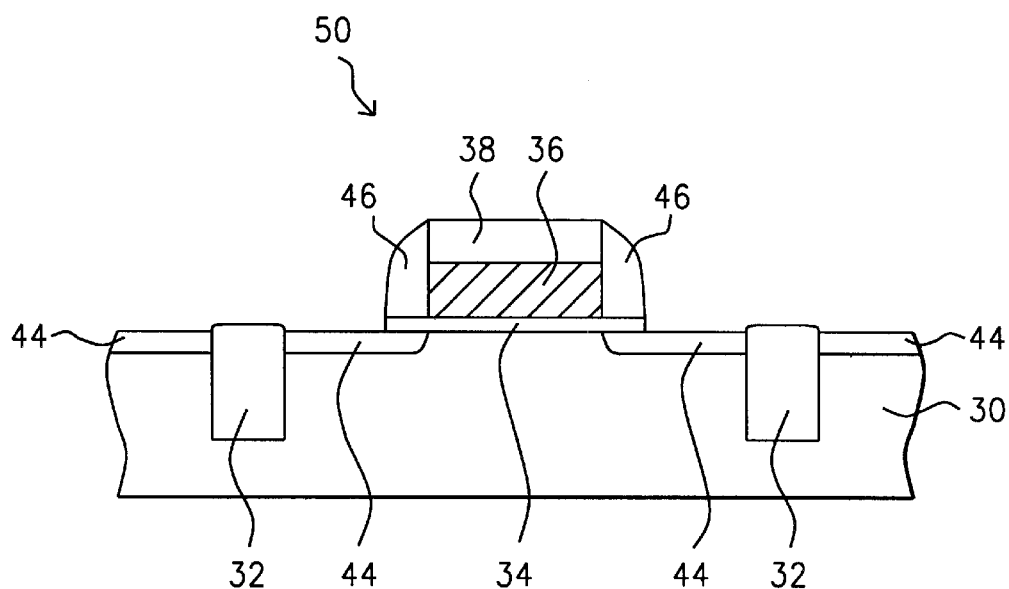

FIG. 3C shows a cross section of the partially completed MOSFET after the polysilicon gate etch. Arsenic ions are now implanted to form the LDD regions 44 using the combined BPSG 38 hardmask 39 polysilicon gate 36 structure as a mask. Dosages and energies for the implantation of LDD regions are well known in the art, alternatively, another n-type dopant ion such as phosphorous or antimony may be used for the LDD implant. The arsenic is implanted through the gate oxide 34. Referring now to the cross section in FIG. 3D, silicon oxide sidewall spacers 46 are formed along the periphery of the residual hardmask/polysilicon gate structure. Sidewall spacer formation is a well known procedure wherein a conformal layer of spacer material, typically silicon oxide, is deposited over the wafer by CVD methods and then anisotropically etched back to the silicon surface by RIE leaving the spacer material along features with vertical edges such as gate structures.

The residual hardmask material 38 is now removed by etching in 50:1 aqueous HF. The etchant is prepared by diluting one volume of 49% semiconductor grade HF with 50 volumes of DI(de-ionized) water. The thickness of the residual hardmask 38 at this point in processing is between about 15 and 40 nm. Because the hardmask 38 is formed of BPSG, it's etch rate in aqueous HF is much greater than that of silicon oxide. The 50:1 HF etches BPSG at a rate of about 200 nm./min. and $SiO_2$ at a rate of about 5 nm./min. While the residual BPSG hardmask 39 is completely removed in about 12 seconds, the loss of exposed silicon oxide STI regions 32 is only about 10 Angstroms.

Figure 3E:
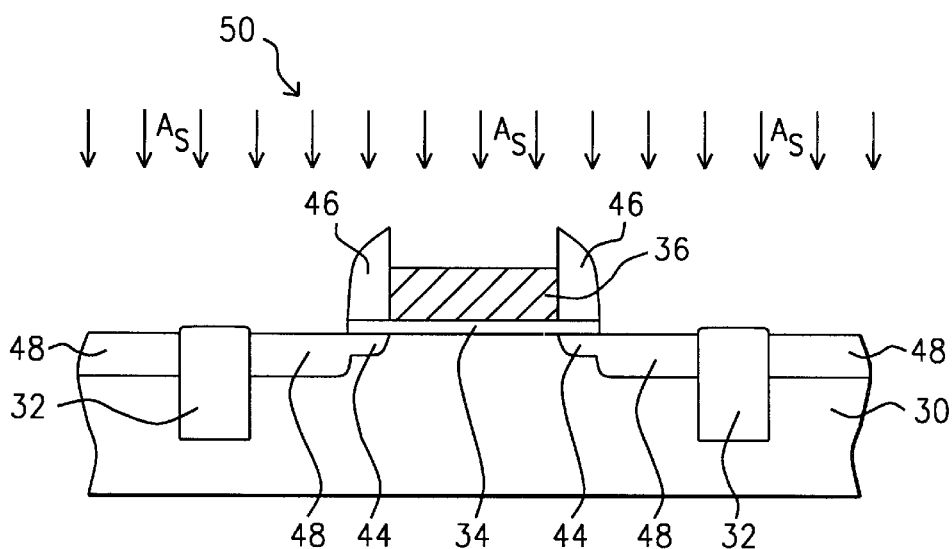

Referring to FIG. 3E, the structure is shown with the hardmask removed. The source/drain regions 48 are now formed by implanting arsenic ions into the active silicon regions external to the sidewall spacers 46. In addition the gate electrode 36 also receives the arsenic ion implant. Dosages and energies for the implantation of source/drain regions of MOSFETs are well known in the art, alternatively, another n-type dopant ion such as phosphorous or antimony may be used for the source/drain ion implant.

Figure 3F:
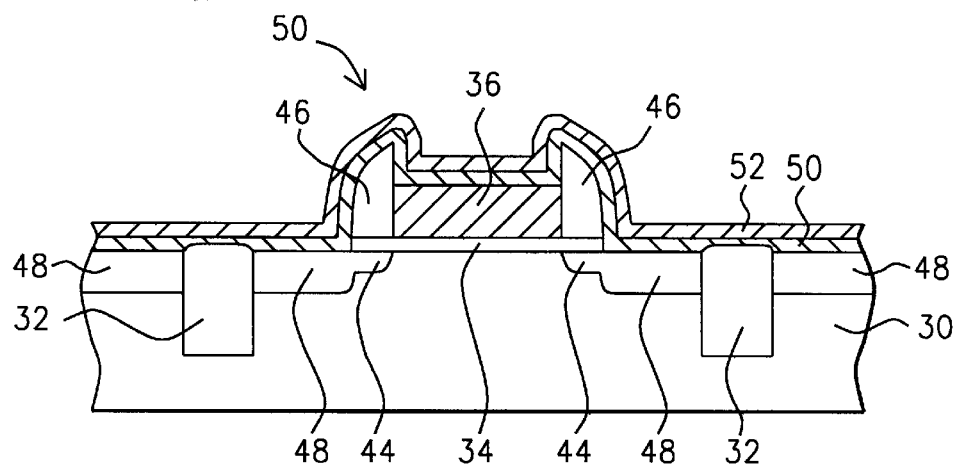

Referring to FIG. 3F, a titanium layer 50 having a thickness of 300 Angstroms or thereabout is then deposited over the wafer by sputtering. Immediately thereafter and without breaking vacuum a titanium nitride layer 52 having a thickness of 250 Angstroms or thereabout is sputtered over the titanium layer 50. This may be accomplished by sputtering a titanium target first with argon to form the titanium layer 50 and then with nitrogen to form the titanium nitride layer 52. Alternately interchangeable targets of titanium and of titanium nitride may be used in the same chamber. A thermal treatment, for example RTA (rapid thermal annealing), causes the portions of the titanium in contact with silicon to react and form titanium silicide ($TiSi_2$). Portions of the titanium layer over oxide such as the STI 32 and the sidewall spacers 46 do not react providing the temperature of the RTA is sufficiently low, for example around 650° C. Subsequent dissolution of unreacted titanium using an aqueous etchant containing $H_2O_2$ and $NH_4OH$, leaves the $TiSi_2$ 54 and over the source/drain regions 48 and over the polysilicon gate electrode 36 respectively. The cross section of this configuration is shown in FIG. 3G.

It should be noted that, by leaving the residual BPSG hardmask 39 in place during sidewall formation, the path distance "d" between the silicide 54 on the gate 36 and the corresponding silicide 54 on the adjacent source drain regions 48 is lengthened by the jutting upward of the sidewall spacers 46 above the level of the gate silicide 54. This increased distance serves to further reduce the chances of gate-to-source/drain shorts.

The embodiment employs a refractory metal layer with a superjacent protective layer of TiN. Alternately, another refractory metal layer, for example, Ta or W could used to form a silicide layer on the exposed silicon surfaces. Similarly, other materials such as TaN could be employed to form the protective layer over the refractory metal layer or the protective layer could be omitted.

Figure 3G:
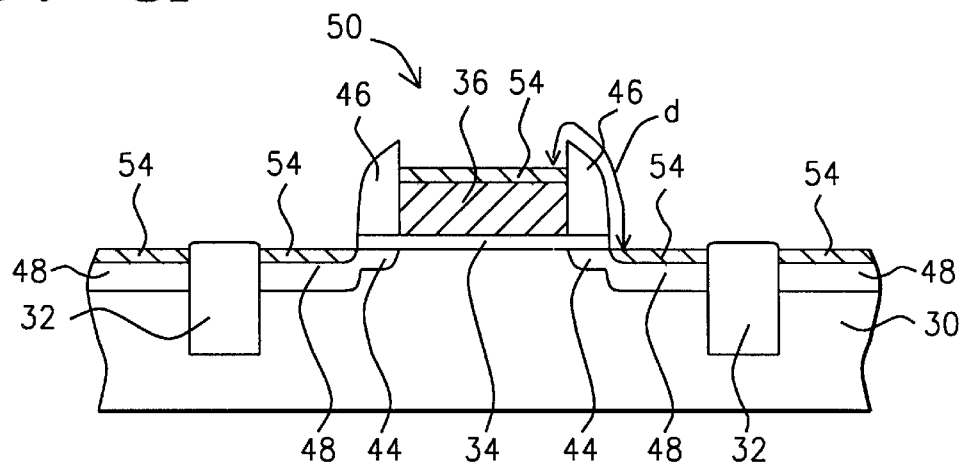

The now completed MOSFET is shown in FIG. 3G. Further processing includes the deposition of an insulative layer (not shown) over the entire structure 50 and the formation of conductive contacts to the source, drain, and gate electrode elements of the MOSFET through openings etched in the insulative layer.

The embodiments of this invention utilize a p-type silicon substrate. An n-type silicon substrate could also be used without departing from the concepts therein provided. It should also be understood that the substrate conductivity type as referred to herein does not necessarily refer to the conductivity of the starting wafer but could also be the conductivity of a diffused region within a wafer wherein the semiconductor devices are incorporated.

While this invention has been particularly shown and described with reference to the preferred embodiments thereof, it will be understood by those skilled in the art that various changes in form and details may be made without departing from the spirit and scope of the invention.

While the embodiment describes the formation of a polysilicon gate MOSFET with silicon oxide STI, the teachings of the invention may also be applied to forming a hardmask suitable for etching other polysilicon features disposed over silicon oxide layers whereby residual hardmask may be subsequently removed by wet etching without degrading exposed silicon oxide features.

What is claimed is:

1. A method for forming a hardmask on a polysilicon layer disposed over a silicon oxide layer, etching said polysilicon layer, and then removing said hardmask by wet etching comprising:
   (a) providing a substrate with a polysilicon layer formed on a silicon oxide layer;
   (b) depositing a silicate glass layer which etches faster in dilute aqueous HF than silicon oxide;
   (c) thermally flowing said silicate glass layer;
   (d) patterning said silicate glass layer to form a hardmask;
   (e) anisotropically etching said polysilicon layer, thereby forming a polysilicon pattern and exposing said silicon oxide layer; and
   (f) removing residual said hardmask by etching in dilute aqueous HF whereby residual said hardmask is removed without removing exposed said silicon oxide layer.

2. The method of claim 1 wherein said dilute aqueous HF is formed by diluting one part by volume of approximately 49 percent aqueous HF with 50 parts by volume of de-ionized water.

3. The method of claim 1 wherein said silicate glass layer is a borophosphosilicate glass.

4. The method of claim 3 wherein said flowing of said silicate glass layer is accomplished by rapid thermal annealing at a temperature of between about 500 and 1,000° C. in a nitrogen ambient.

5. The method of claim 3 wherein said silicate glass contains between about 4 and 4.5 weight percent boron and between about 4 and 4.5 weight percent phosphorous.

6. The method of claim 1 wherein said silicate glass layer is a phosphosilicate glass.

7. A method for forming a self-aligned polysilicon gate MOSFET with shallow trench silicon oxide isolation comprising:
   (a) providing a silicon wafer;
   (b) forming a silicon oxide filled trench in said silicon wafer comprising shallow trench isolation surrounding a region of active silicon surface;
   (c) forming a gate oxide;
   (d) depositing a polysilicon layer;
   (e) depositing a silicate glass layer which etches faster in dilute aqueous HF than silicon oxide;
   (f) thermally flowing said silicate glass layer;
   (g) patterning said silicate glass layer to form a hardmask defining a polysilicon gate;
   (h) anisotropically etching said polysilicon layer, thereby forming a polysilicon gate;
   (i) implanting a first dose of dopant impurity ions into said wafer to form LDD regions;
   j) forming sidewall spacers along the periphery of said polysilicon gate;
   (k) removing residual said hardmask by etching in dilute aqueous HF whereby residual said hardmask is removed without gouging said shallow trench isolation to expose silicon along the walls of said trench;
   (l) implanting a second dose of dopant impurity ions into said wafer to form source/drain regions with p/n junctions abutting said shallow trench isolation;
   (m) depositing a refractory metal layer;
   (n) depositing a protective layer over said refractive metal layer;
   (o) subjecting said wafer to thermal annealing, thereby forming refractory metal suicide over said source/drain regions and over said polysilicon gate; and
   (p) etching residual said protective layer and said refractory metal layer, thereby forming a self-aligned polysilicon gate MOSFET.

8. The method of claim 7 wherein said sidewall spacers are formed of an insulative material taken from the group consisting of silicon oxide, silicon nitride, and silicon oxynitride.

9. The method of claim 7 wherein said dilute aqueous HF is formulated by diluting one part by volume of approximately 49 percent aqueous HF with about 50 parts by volume of de-ionized water.

10. The method of claim 7 wherein said silicate glass layer is a borophosphosilicate glass.

11. The method of claim 10 wherein said silicate glass contains between about 4 and 4.5 weight percent boron and between about 4 and 4.5 weight percent phosphorous.

12. The method of claim 10 wherein said flowing of said silicate glass layer is accomplished by rapid thermal annealing at a temperature of between about 500 and 1,000° C. in a nitrogen ambient.

13. The method of claim 7 wherein said silicate glass layer is a phosphosilicate glass.

* * * * *